(12) United States Patent
Lee et al.

(10) Patent No.: US 7,887,994 B2
(45) Date of Patent: Feb. 15, 2011

(54) PHOTORESIST COMPOSITION, COATING METHOD THEREOF, METHOD OF FORMING ORGANIC FILM PATTERN USING THE SAME AND DISPLAY DEVICE FABRICATED THEREBY

(75) Inventors: Yeong Beom Lee, Cheonan (KR); Kyung Seop Kim, Suwon (KR); Jun Young Lee, Yongin (KR); Sung Wook Kang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 462 days.

(21) Appl. No.: 12/024,688

(22) Filed: Feb. 1, 2008

(65) Prior Publication Data

US 2008/0213549 A1    Sep. 4, 2008

(30) Foreign Application Priority Data

Feb. 2, 2007    (KR) ................ 10-2007-0011271

(51) Int. Cl.
    *C08F 2/46* (2006.01)
    *C08J 3/28* (2006.01)

(52) U.S. Cl. ............ 430/287.1; 522/148; 522/99; 430/192; 430/197; 430/175; 430/176; 430/270.1; 430/272.1

(58) Field of Classification Search ............ 522/99, 522/172, 148; 430/192, 197, 175, 176, 270.1, 430/272.1, 278.1; 528/10, 26, 29, 43
See application file for complete search history.

(56) References Cited

U.S. PATENT DOCUMENTS

| | | | |
|---|---|---|---|
| 4,822,716 A * | 4/1989 | Onishi et al. | ............ 430/192 |
| 5,017,453 A * | 5/1991 | Onishi et al. | ............ 430/176 |
| 5,158,854 A | 10/1992 | Imamura et al. | |
| 5,198,520 A | 3/1993 | Onishi et al. | |
| 7,374,856 B2 * | 5/2008 | Suwa et al. | ............ 430/169 |
| 2003/0193624 A1 | 10/2003 | Kobayashi et al. | |
| 2005/0089790 A1 | 4/2005 | Lee et al. | |
| 2006/0115766 A1 | 6/2006 | Suwa et al. | |

FOREIGN PATENT DOCUMENTS

| | | |
|---|---|---|
| EP | 0 231 497 B1 | 3/1994 |
| EP | 1 628 160 A2 | 2/2006 |
| EP | 1 662 322 A2 | 5/2006 |
| JP | 200288158 A | 3/2002 |
| JP | 20044733 A | 1/2004 |
| JP | 2004177513 A | 6/2004 |
| JP | 2006018249 | 1/2006 |
| JP | 2006154037 A | 6/2006 |
| JP | 2006178436 A | 7/2006 |
| KR | 19900002363 B1 | 4/1990 |
| KR | 1020040064596 A | 7/2004 |
| KR | 1020060059202 A | 6/2006 |
| KR | 100618487 B1 | 8/2006 |

OTHER PUBLICATIONS

European Search Report for Application No. 08001811.2-1226: Dated: Jul. 31, 2008.

* cited by examiner

*Primary Examiner*—Sanza L McClendon
(74) *Attorney, Agent, or Firm*—Cantor Colburn LLP

(57) ABSTRACT

Disclosed herein is a photoresist composition suitable for coating onto a large substrate and having improved coating uniformity to prevent occurrence of stains, a coating method thereof, a method of forming an organic film pattern using the same, and a display device fabricated thereby. The present invention thus provides a photoresist composition comprising a polymeric resin with an incorporated polysiloxane resin, a photosensitive compound, and an organic solvent. Accordingly, the photoresist composition can be coated onto a large substrate by a spinless coating method, and thereby coating uniformity can be improved, the occurrence of stains such as cumulous stains and resin streaks can be prevented, and the coating rate and quality of a final product prepared using the photoresist composition can also thereby be enhanced.

31 Claims, 5 Drawing Sheets

PHOTORESIST COMPOSITION, COATING METHOD THEREOF, METHOD OF FORMING ORGANIC FILM PATTERN USING THE SAME AND DISPLAY DEVICE FABRICATED THEREBY

This application claims priority to Korean Patent Application No. 10-2007-0011271 filed on Feb. 2, 2007, and all the benefits accruing therefrom under 35 U.S.C. 119(a), the content of which is disclosed herein by reference in its entirety.

BACKGROUND OF THE INVENTION

1. Field of the Invention

The present invention relates to a photoresist composition, a coating method thereof, a method of forming an organic film pattern using the same, and a display device fabricated thereby, and more particularly, to a photoresist composition for coating onto a large substrate with improved coating uniformity to prevent occurrence of stains, a coating method thereof, a method for forming an organic film pattern using the same, and a display device fabricated thereby.

2. Description of the Related Art

A liquid crystal display ("LCD") is one of various types of flat panel display that are currently and widely used. An LCD is configured by arranging a thin film transistor substrate with pixel electrodes formed on a surface thereof, and a color filter substrate with a common electrode formed a surface thereof, so that the surfaces of the thin film transistor substrate having the pixel electrodes and the surface of the color filter substrate having the common electrode are held opposite and coplanar to each other at a fixed distance, and interposing a liquid crystal layer between the opposing surfaces of the thin film transistor substrate and the color filter substrate. Images are displayed on such an LCD by applying a voltage to the pixel electrodes and the common electrode to rearrange liquid crystal molecules in the liquid crystal layer so that the amount of light transmitted through the liquid crystal layer is controlled.

Recently, as the demand for large LCDs increase, a commensurate increase in the size of the substrate for such LCDs is inevitably required. Therefore it is necessary to develop a new photoresist composition with coating uniformity suitable to fabricate a large substrate.

"Coating uniformity", as used herein, means the degree of uniformity of thickness of an organic film that is coated on a substrate. Coating uniformity has an influence on aperture ratio, resolution, circuit line width, and the like, during post-processing. Due to the reflectivity difference that results from minute thickness differences in the organic film, any defects that occur in the organic film are also revealed in the final product.

Furthermore, when fabricating a large LCD, conventional photoresist composition coating methods such as roll coating, spin coating, slit and spin coating, or the like, are not sufficient to coat a photoresist composition onto a large substrate with the required coating uniformity. In particular, it is impossible to coat a conventional photoresist composition onto a large substrate by spin coating, as the durability of a spin motor for a spin coating apparatus that would ordinarily be used would be insufficient given the size of the substrate.

A slit nozzle coating device has therefore been suggested as a coating device for a large substrate. When such a slit nozzle coating device is used, it is possible to reduce the amount of photoresist composition consumed, and further it is not necessary to carry out an edge bead removal process to remove any concentrated photoresist composition from an edge of a substrate, in comparison with the need to remove the edge bead that accumulates with a conventional spin coating process. However, the slit nozzle coating device causes resin streaks, and also produces cumulous stains, neither of which is generated by the conventional spin coating process.

A resin streak is classifiable as either or both of a small streak, which is caused by either or both of a non-uniform penetration of photoresist composition into the substrate, or by discharge of a non-uniform amount of photoresist composition from a slit nozzle occurring at a starting point on a substrate; and a large streak created around the centerline along the coating direction.

The cumulous stain may be created over a portion of the substrate, or the entire area of the substrate, and is mainly caused by non-uniformity of the coating thickness.

The presence of streaks and/or stains increases the defect ratio for the entire process and reduces the quality of the final product. Therefore, a photoresist composition that is suitable for coating large substrates and which satisfies the process requirements of high light transmissivity and sensitivity at the same time is desired. However, conventional polyacrylate based resin materials are limited as to either or both of high transmissivity and sensitivity. Therefore, a novel photoresist composition that can replace the conventional polyacrylate based resins is required.

BRIEF SUMMARY OF THE INVENTION

Therefore, in view of the limitations of the prior art, provided herein is a photoresist composition for coating onto a large substrate, having improved coating uniformity, which prevents the occurrence of stains such as resin streaks and cumulous stains, and which increases the coating rate of a photoresist composition on a surface of a substrate when using a spinless coating method, and thereby improves the quality of a final product prepared therefrom; a coating method for the photoresist composition; a method of forming an organic film pattern using the photoresist composition; and a display device fabricated with the photoresist composition.

According to an embodiment, a photoresist composition, comprises a polymeric resin with an incorporated polysiloxane resin; a photosensitive compound; and an organic solvent.

In an embodiment, the polymeric resin has a weight-average molecular weight (Mw) of 500 to 20,000, and the polymeric resin is included in an amount of 10 to 30% by weight of the photoresist composition.

In an embodiment, the photoresist composition has a viscosity of 1 to 25 centipoise ("cps").

In an embodiment, the polysiloxane resin has the following Chemical Formula 1:

[Chemical Formula 1]

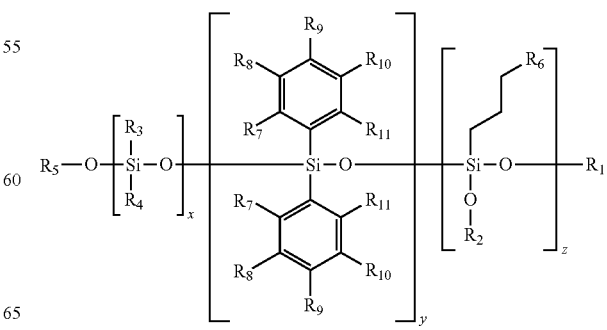

wherein x, y, and z each represent monomer mole fractions of greater than 0 and less than 1, where the sum of x+y+z is 1, and each of $R_1$, $R_2$, $R_3$, $R_4$, $R_5$, $R_6$, $R_7$, $R_8$, $R_9$, $R_{10}$, and $R_{11}$ is independently H, $C_mH_{2m+1}$, —OH, —$OC_mH_{2m+1}$ (where m is 1 to 5), an acryl-based functional group, a functional group of the following Molecular Formula 1:

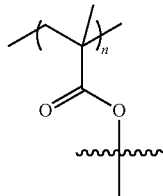

[Molecular Formula 1]

wherein n is an integer greater than 0, and a functional group of the following Molecular Formula 2:

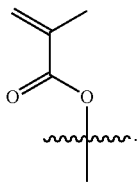

[Molecular Formula 2]

In another, more specific embodiment, the polysiloxane resin has the following Chemical Formula 2:

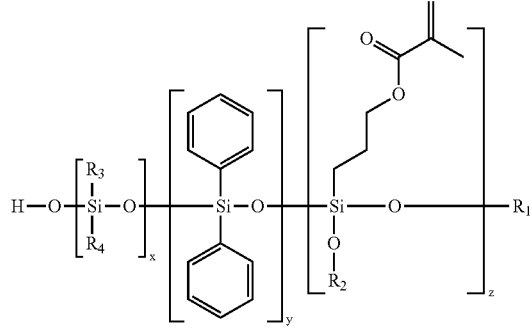

[Chemical Formula 2]

wherein x, y, and z each represent monomer mole fractions of greater than 0 and less than 1, where the sum of x+y+z is 1, and each of $R_1$, $R_2$, $R_3$, and $R_4$ is independently H or an alkyl group of the formula $C_nH_{2n+1}$, where n is 1 to 5.

In another embodiment, the photosensitive compound is a diazide-based photosensitive compound, and the diazide-based photosensitive compound is present in an amount of 1 to 10% by weight of the photoresist composition. In a specific embodiment, the diazide-based photosensitive compound is present in an amount of 1 to 5% by weight of the composition.

In an embodiment, the diazide-based photosensitive compound is prepared by reacting at least one hydroxy compound and one sulfonic acid derivative selected from the group consisting of tetrahydroxy benzophenone, a derivative of 2-diazo-1-naphthol-5-sulfonic acid, polyhydroxy benzophenone, and a derivative of 1,2-naphthoquinone diazide sulfonic acid, and can be prepared by esterification of tetrahydroxy benzophenone with 2-diazo-1-naphthol-5-sulfonic acid.

In another embodiment, the diazide-based photosensitive compound can comprise at least one selected from the group consisting of 2,3,4,4'-tetrahydroxybenzophenone-1,2-naphthoquinonediazide-5-sulfonate, diazonaphthoquinone sulfonic ester, and 2,3,4-trihydroxy benzophenone-1,2-naphthoquinonediazide-5-sulfonate, and in an embodiment, can be a material represented by the following Chemical Formula 3:

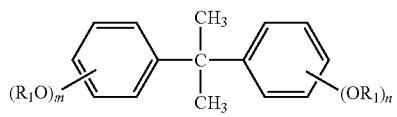

[Chemical Formula 3]

wherein each of m and n is independently 1 to 3, $R_1$ is any one selected from the group consisting of H, $C_xH_y$, and diazanaphthoquinone ("DNQ") as represented by the following Molecular Formula 3:

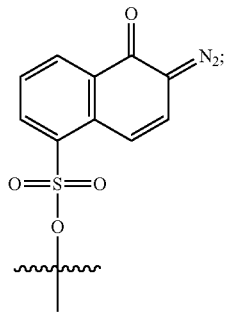

[Molecular Formula 3]

or a material represented by the following Chemical Formula 4:

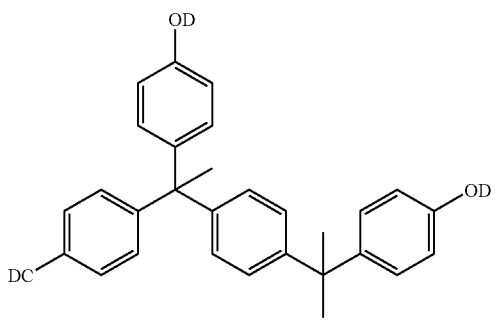

[Chemical Formula 4]

wherein D is DNQ represented by the Molecular Formula 3.

In an embodiment, the organic solvent can be present in an amount of 60 to 90% by weight of the photoresist composition, and can be at least one selected from the group consisting of an acetate-based solvent, a lactate-based solvent, a propionate-based solvent, and an ether-based solvent.

In an embodiment, the organic solvent is at least one selected from the group consisting of 4-hydroxy-4-methyl-2- pentanone, propylene glycol methyl ether, ethyl acetoacetate, ethyl lactate, ethyl cellosolve acetate, gamma-butyrolactone, 2-methoxyethyl acetate, ethyl beta-ethoxypropionate, n-propyl acetate, and n-butyl acetate, and is in a specific embodiment a mixture of 4-hydroxy-4-methyl-2-pentanone, propylene glycol methyl ether, and ethyl acetoacetate.

In an embodiment, the photoresist composition can further comprise at least one additive selected from the group consisting of a coloring agent, a dye, an anti-striation agent, a plasticizer, an adhesion promoter, and a surfactant. The additive can have a molecular weight lower than the polymeric resin.

In an embodiment, the surfactant can be a Si-based surfactant or an F-based surfactant, and is present in the photoresist composition in an amount of 500 to 4,000 ppm.

According to another embodiment, a coating method is provided for a photoresist composition including a polymeric resin with an incorporated polysiloxane resin, a photosensitive compound, and an organic solvent onto a substrate, with a spinless coating method.

According to a further embodiment, a coating method for a photoresist composition comprises: storing a photoresist composition including a polymeric resin with an incorporated polysiloxane resin, a photosensitive compound, and an organic solvent in a storage unit of a coating device; discharging the stored photoresist composition onto a surface of the substrate, starting from any one side (i.e., edge) of the surface of the substrate, through a nozzle of the coating device; and moving the nozzle from one side to the other opposite side of the substrate to continuously coat the photoresist composition discharged from the nozzle onto the surface of the substrate.

According to a still further embodiment, a method of forming an organic film pattern comprises: coating a photoresist composition including a polymeric resin with an incorporated polysiloxane resin, a photosensitive compound and an organic solvent onto a surface of a substrate; and patterning the photoresist composition coated on the surface of the substrate.

In an embodiment, the substrate can be a thin film transistor substrate.

In an embodiment, patterning the photoresist composition comprises drying the photoresist composition under reduced pressure, soft baking the dried photoresist composition, selectively exposing the soft baked photoresist composition to light, developing the selectively exposed photoresist composition, and curing the developed photoresist composition.

In an embodiment, developing the photoresist composition comprises dipping the substrate coated with the exposed photoresist composition into at least one aqueous alkaline developing solution, where the alkaline developing solution comprises a base compound selected from the group consisting of alkali hydroxide, ammonium hydroxide, and tetramethyl ammonium hydroxide.

According to a still further embodiment, there is provided a display device derived from a substrate having an organic film formed thereon by coating a photoresist composition comprising a polymeric resin with an incorporated polysiloxane resin, a photosensitive compound, and an organic solvent. Also in an embodiment, an intermediate structure for a display device comprises a substrate having disposed thereon a fine patterned organic film derived from a photoresist composition comprising a polymeric resin with an incorporated polysiloxane resin, a photosensitive compound, and an organic solvent. A thin film transistor substrate can be derived from the intermediate structure, and a display device can be derived from the thin film transistor substrate.

BRIEF DESCRIPTION OF THE DRAWINGS

The above and other features and advantages of the present invention will become apparent from the following description of embodiments given in conjunction with the accompanying drawings, in which.

DETAILED DESCRIPTION OF THE INVENTION

Figure 1:
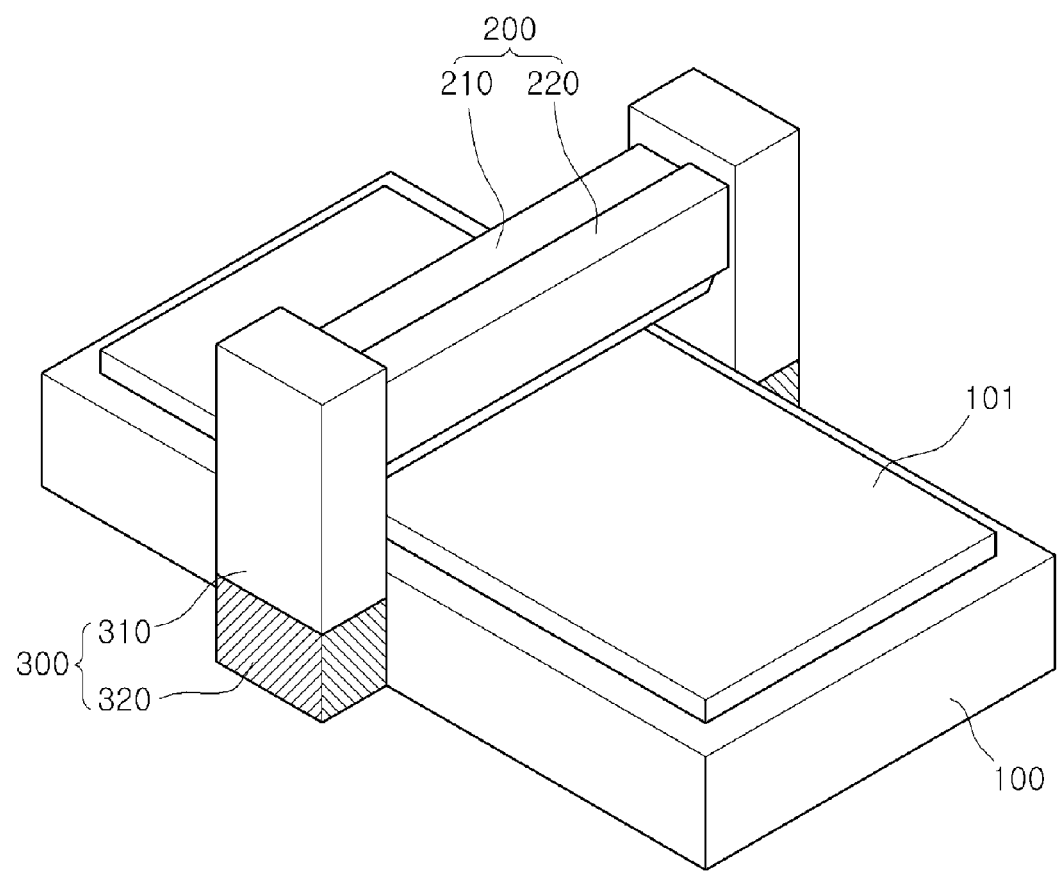
FIG. 1 is a perspective view illustrating an example of a spinless coating device used in a coating method of a photoresist composition according to an exemplary embodiment.

Hereinafter, a photoresist composition according to an embodiment will be described in detail.

It will be understood that when an element is referred to as being "on" another element, it can be directly on the other element or intervening elements may be present therebetween. In contrast, when an element is referred to as being "disposed on" or "formed on" another element, the elements are understood to be in at least partial contact with each other, unless otherwise specified.

The terminology used herein is for the purpose of describing particular embodiments only and is not intended to be limiting of the invention. As used herein, the singular forms "a", "an" and "the" are intended to include the plural forms as well, unless the context clearly indicates otherwise. The use of the terms "first", "second", and the like do not imply any particular order but are included to identify individual elements. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the drawings, like reference numerals in the drawings denote like elements and the thicknesses of layers and regions are exaggerated for clarity.

The photoresist composition comprises a polymeric resin incorporating a polysiloxane resin, a photosensitive compound, and an organic solvent.

The polymeric resin contained in the photoresist composition has a weight-average molecular weight (Mw) of 500 to 20,000 and is included to the photoresist composition in an amount of 10 to 30% by weight of the photoresist composition such that the viscosity of the photoresist composition is maintained at 1 to 25 cps upon addition of the polymeric resin. It will be understood that, as used herein, all expressions of molecular weight including polymer molecular weights (for example, Mw) are in units of grams per mole (g/mol).

In an embodiment, where the viscosity of the photoresist composition is less than 1 cps, the photoresist composition cannot be coated at the desired thickness since a side flow phenomenon in which the photoresist composition flows in a lateral direction predominates, and thus is lower than the required viscosity. Also in an embodiment, where the viscosity of the photoresist composition is greater than 25 cps, the side flow of the photoresist composition is impeded due to excessively high viscosity of the photoresist composition, and thus, coating uniformity of the photoresist composition is reduced.

A polysiloxane resin is useful as a polymeric resin in the photoresist composition. In an embodiment, an organic material which has an additionally polymerized siloxane group and a hydroxy group connected to an end thereof is represented as an example of the polysiloxane resin in the following Chemical Formula 1:

[Chemical Formula 1]

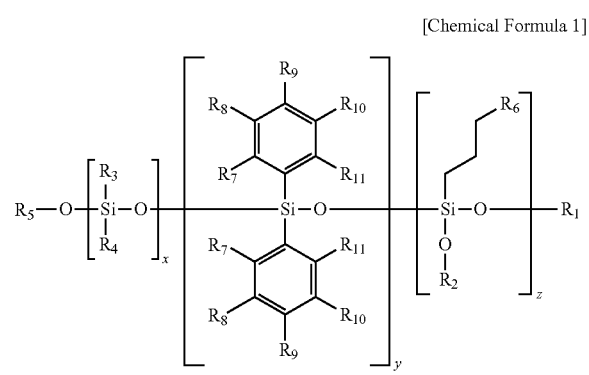

wherein x, y, and z each represent monomer mole fractions of greater than 0 and less than 1, where the sum of x+y+z is 1, and each of $R_1$, $R_2$, $R_3$, $R_4$, $R_5$, $R_6$, $R_7$, $R_8$, $R_9$, $R_{10}$, and $R_{11}$ is independently H, $C_mH_{2m+1}$ where m is 1 to 5, —OH, —$OC_mH_{2m+1}$ where m is 1 to 5, an acryl-based functional group, a functional group of the following Molecular Formula 1:

[Molecular Formula 1]

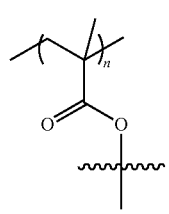

wherein n is an integer greater than 0; or a functional group of the following Molecular Formula 2:

[Molecular Formula 2]

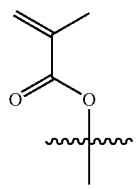

wherein each of $R_1$, $R_2$ and $R_4$ is independently H or $C_mH_{2m+1}$; $R_3$ and $R_5$ are independently —OH or —$OC_mH_{2m+1}$; $R_6$ is a functional group of the Molecular Formula 1 or 2; and $R_7$, $R_8$, $R_9$, $R_{10}$ and $R_{11}$ are independently H, $C_mH_{2m+1}$, or —$OC_mH_{2m+1}$, where m is 1 to 5.

In a specific embodiment, the polysiloxane resin comprises the structure of the following Chemical Formula 2:

[Chemical Formula 2]

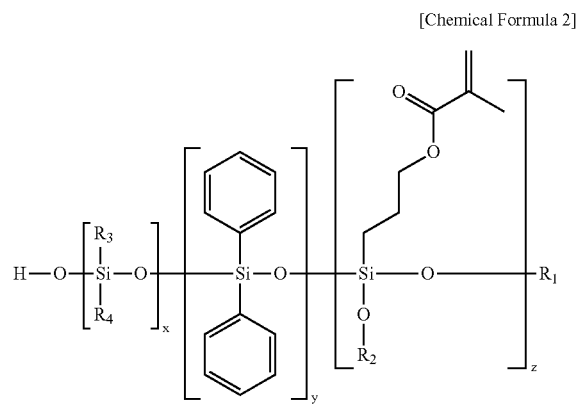

wherein x, y, and z each represent monomer mole fractions of greater than 0 and less than 1, where the sum of x+y+z is 1, and $R_1$, $R_2$, $R_3$ or $R_4$ is independently H or an alkyl group of the formula $C_nH_{2n+1}$, where n is 1 to 5.

A polysiloxane resin as defined in Chemical Formula 1 or 2 can, in an embodiment, be prepared by the condensation of at least one of each of the following monomers: a first monomer comprising dialkoxydialkylsilane or dialkoxyalkylhydridosilane; a second monomer comprising a dialkoxydiaryl silane; and a third monomer comprising a functionalized alkyltrialkoxysilane. Conditions useful for condensing these monomers to prepare the polysiloxane resins are known and may be effected by acid or base catalyzed condensation of the monomers with a stoichiometric or sub-stoichiometric amount of water, optionally in the presence of a solvent such as an alcohol or an ether. In an embodiment, the first monomer can be present in a mole fraction of 0.01 to 0.5, the second monomer can be present in a mole fraction of 0.01 to 0.5, and the third monomer can be present in a mole fraction of 0.05 to 0.3, where the sum of the mole fractions of the first, second, and third monomers is 1. As used herein, mole fraction of a monomer or polymerized monomeric unit is determined by the molar amount of a monomer divided by the total number of moles of all monomers specified; in this way for example, the mole fraction of a first monomer is determined to be the quotient of the number of moles of the first monomer divided by the sum of the moles of first, second, and third monomers (where three monomers are present).

A polysiloxane resin comprising Chemical Formula 1 or 2 has a weight average molecular weight of 500 to 20,000, and the viscosity of the photoresist composition prepared with the polysiloxane resin can be maintained at 1 to 25 cps when the polysiloxane resin is included in the photoresist composition in an amount of 10 to 30% by weight of the photoresist composition.

The photoresist composition comprising the polysiloxane resin has higher residual film thickness ratio and higher transmissivity than would be obtained for a comparable photoresist composition comprising a typical acrylate-based resin.

The following Table 1 shows typical residual film thickness ratios, sensitivities, and transmissivities of light for photoresist compositions prepared with different polymeric resins (i.e., polysiloxane resins as disclosed herein, and polyacrylate resins for purposes of comparison). As disclosed herein, "film thickness ratio" refers to the proportion (expressed as a percentage) of the thickness of an unexposed film of the photoresist composition that remains after treatment with a developer solution. Table 1 shows a comparison of these properties of photoresist compositions in which the polysiloxane resin is included in a representative photoresist composition according to an embodiment, and a polyacrylate resin is included in a comparative photoresist composition comparable to a commercially available photoresist composition, respectively.

TABLE 1

| | Type of polymeric resin | |
|---|---|---|
| | Polysiloxane resin | Polyacrylate resin |
| Residual film thickness ratio [%] | 98 or more | 89.5~95 |
| Sensitivity [mJ/cm$^2$] | 60 or less | 83~110 |
| Transmissivity [%] | 97 or more | 89~93 |

As shown in Table 1, the polysiloxane resin containing photoresist composition has higher residual film thickness ratio and transmissivity than the polyacrylate resin containing photoresist composition. Moreover, the sensitivity of the polysiloxane resin containing photoresist composition is about twice as high as the polyacrylate resin containing photoresist composition. Therefore, the polysiloxane resin containing photoresist composition has a greater number of desirable properties than the polyacrylate resin containing photoresist composition.

A diazide-based photosensitive compound is used as a photosensitive compound (or photosensitizer). In an embodiment, the diazide-based photosensitive compound is included in the photoresist composition in an amount of 1 to 10%, specifically 1 to 5%, by weight of the photoresist composition.

If the diazide-based photosensitive compound is present in an amount of less than 1% by weight of the photoresist composition, the commensurate retardation of the photosensing rate of the photoresist composition results in an excessively long processing time. If, however, the diazide-based photosensitive compound is present in an amount of greater than 10% by weight of the photoresist composition, the photosensing rate of the photoresist composition increases excessively to cause a lower yield in the subsequent processing due to the remarkable, accompanying reduction in the residual film thickness ratio. Therefore, 1 to 5 wt % of the diazide-based photosensitive compound is preferably included in the photoresist composition to provide more stable processing time and production yield.

The diazide-based photosensitive compound can be prepared by reacting at least one hydroxy compound and one sulfonic acid derivative selected from the group consisting of tetrahydroxy benzophenone, a derivative of 2-diazo-1-naphthol-5-sulfonic acid, polyhydroxy benzophenone, and a derivative of 1,2-naphthoquinone diazide sulfonic acid.

The photosensitive compound so prepared can include at least one selected from the group consisting of 2,3,4,4'-tetrahydroxybenzophenone-1,2-naphthoquinonediazide-5-sulfonate, a 1,2-diazonaphthoquinone sulfonic acid ester, and 2,3,4-trihydroxy benzophenone-1,2-naphthoquinonediazide-5-sulfonate.

In a specific embodiment, the 2,3,4,4'-tetrahydroxybenzophenone-1,2-naphthoquinonediazide-5-sulfonate prepared by esterification of tetrahydroxy benzophenone with a derivative of 2-diazo-1-naphthol-5-sulfonic acid is useful as the photosensitive compound.

The diazonaphthoquinone sulfonic acid ester can be obtained by partial esterification of 2,1-diazonaphthoquinone-5-sulfonic chloride with a variety of polyphenol compounds or hydroxy compounds, or by full esterification of 1,2-diazonaphthoquinone-5-sulfonic acid chloride with all hydroxy groups of the polyphenol compound or hydroxy compound. This esterification can be carried out effectively using a solvent such as acetone, dioxane, N-methylpyrrolidone, or a mixed solvent thereof, in the presence of a trialkylamine such as trimethylamine or triethylamine, or in the presence of a basic catalyst such as sodium carbonate or bicarbonate.

Further, an organic material represented by the following Chemical Formula 3 can be used as an exemplary photosensitive compound:

[Chemical Formula 3]

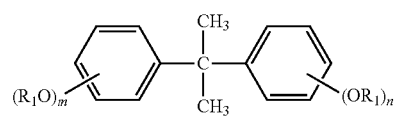

wherein R$_1$ is selected from the group consisting of H, a C$_{1-18}$ hydrocarbon group, and a diazonaphthoquinone (DNQ) represented by the following Molecular Formula 3, and each of m and n is 1 to 3:

[Molecular Formula 3]

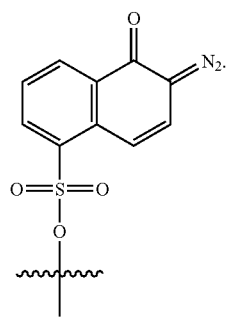

The DNQ represented by the Molecular Formula 3 is a photosensitive compound and is a soluble resin which can be dissolved in a subsequent developing step by means of photoreaction in an exposure step to be described later.

Further, an organic material represented by the following Chemical Formula 4 can be used as another exemplary photosensitive compound:

[Chemical Formula 4]

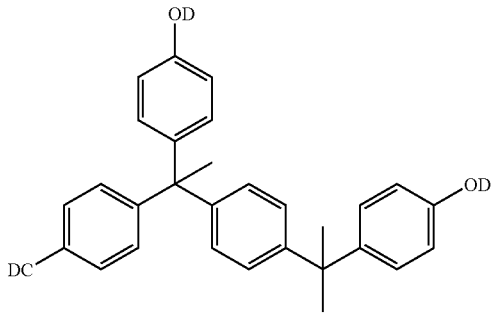

wherein D is DNQ as represented by Molecular Formula 3.

An organic solvent is included in the photoresist composition in an amount of 60 to 90% by weight of the photoresist composition, and the organic solvent can comprise at least one of an acetate-based solvent, a lactate-based solvent, a propionate-based solvent, or an ether-based solvent.

Specifically, the organic solvent can comprise at least one selected from the group consisting of 4-hydroxy-4-methyl-2-pentanone ("DAA"), propylene glycol methyl ether ("PGME"), ethyl acetoacetate ("ACAC"), ethyl lactate ("EL"), ethyl cellosolve acetate ("EDM"), gamma-butyrolactone ("GBL"), 2-methoxyethyl acetate ("MMP"), ethyl beta-ethoxypropionate ("EEP"), n-propyl acetate ("nPAC"), and n-butyl acetate ("nBA"). In an embodiment, the organic solvent is a mixture of 4-hydroxy-4-methyl-2-pentanone (DAA), propylene glycol methyl ether (PGME), and ethyl acetoacetate (ACAC).

Each of the n-propyl acetate (nPAC), the n-butyl acetate (nBA), the ethyl acetoacetate (ACAC), and the ethyl cellosolve acetate (EDM) is an acetate-based solvent; the ethyl lactate (EL) is a lactate-based solvent; each of the 2-methoxyethyl acetate (MMP) and the ethyl beta-ethoxypropionate (EEP) is a propionate-based solvent; and the propylene glycol methyl ether (PGME) is an ether-based solvent.

When mixing at least one of the aforementioned organic solvents with at least one other solvent, one of the organic solvents is mixed with the other organic solvent(s) in a weight ratio of 5:95 to 95:5.

When the photoresist composition comprises less than 60 wt % of organic solvent or a mixture of the organic solvents, uniform coating of the photoresist composition becomes difficult due to increased viscosity from the higher solids level of the resulting photoresist composition. Conversely, when the photoresist composition comprises greater than 90 wt % of the organic solvent or mixture of the organic solvents, achieving the desired coating characteristics, for example, coating the photoresist composition at a desired thickness, becomes difficult due to the decreased viscosity resulting from the lower solids level of the photoresist composition.

The photoresist composition can further comprise if necessary an additive including a coloring agent, a dye, an antistriation agent, a plasticizer, an adhesion promoter, a surfactant, and the like, which have lower molecular weights than the organic polymeric resin. The photoresist composition is coated on a surface of a substrate to improve coating performance according to characteristics of individual processes.

Where used, inclusion of a surfactant as an additive can minimize the sizes and shapes of stains that would otherwise be generated during the coating of the photoresist composition, and thereby improves the coating characteristic of the photoresist composition.

An F-based (i.e., fluorinated) surfactant or Si-based (i.e., silicon-based, such as for example, a silicone) surfactant can be used as the surfactant. In an embodiment, an exemplary Si-based surfactant includes a polyoxyalkylene-dimethylpolysiloxane copolymer.

Since the adhesion between a Si-based surfactant (contained in the photoresist composition) and an underlying film formed of $SiN_x$ can be weakened, it is desirable to employ the F-based surfactant.

Such a surfactant is added to the photoresist composition in an amount of 500 to 4,000 ppm by weight, based on the total weight of the photoresist composition. Where the photoresist composition contains less than 500 ppm of the surfactant, the coated photoresist composition can delaminate from the underlying substrate due to decreased adhesion of the photoresist composition. Where the photoresist composition contains greater than 4,000 ppm of surfactant, the adhesion of the photoresist composition increases excessively, and in addition, the price of the photoresist composition increases. Therefore, it is desirable to adjust the content of the surfactant from 500 to 4,000 ppm.

Hereinafter, in an embodiment, a coating method of the photoresist composition, a method of forming an organic film pattern, a display device, and in particular a liquid crystal display device fabricated using the same, and a fabrication method thereof according to an embodiment, will be described with reference to the accompanying drawings.

FIG. 1 is a perspective view illustrating an example of a spinless coating device as used in a coating method of a photoresist composition according to an exemplary embodiment.

Referring to FIG. 1, the spinless coating device includes a stage 100 on which a substrate 101 is securely placed, a nozzle unit 200 placed above the stage 100 to coat a photoresist composition onto the substrate 101, and a drive unit 300 for driving the nozzle unit 200.

Although the substrate 101 is not specifically limited herein, it is desirable to employ a substrate with a size of 1,100×1,200 mm or greater. Such a substrate is useful for fabricating a fifth-generation display device.

The stage 100 allows the object to be treated (i.e., the substrate 101), such as for example a glass substrate, to be placed thereon, and stage 100 generally has a shape corresponding to the size of the substrate 101. A plurality of lift pins (not shown) for lifting the substrate 101 from the stage 100 are installed in the stage 100, and serve to place or lift the substrate 101 onto or from a surface of the stage 100 when loading and unloading the substrate 101 using the lift pins.

Further, a vacuum hole (not shown) can be provided in the stage 100 such that the vacuum hole does not interfere with the lift pins; and a vacuum unit (not shown) such as a pump, can be connected to the vacuum hole to hold the substrate 101 in position on stage 100 by vacuum. Therefore, when the substrate 101 is placed on the stage 100, it is desirable to vacuum hold and affix the substrate to the stage 100 using the vacuum forming section such that the substrate 101 cannot detach from the stage 100 during processing.

The nozzle unit 200 is provided above the stage 100 on which the substrate 101 is securely placed. The nozzle unit 200 is installed toward the substrate 101 to serve to coat the photoresist composition onto a surface of the substrate 101.

Before the photoresist composition is coated onto the substrate 101, it is desirably received into the nozzle unit 200 such that the temperature and dispense amount of the photoresist composition can be adjusted to high degree of precision.

The driving unit 300 includes a pair of Z-axis driving units 310 connected to both ends of the nozzle unit 200 to move the nozzle unit 200 in a vertical direction, i.e., in an up and down direction orthogonal to the plane of the substrate 101, and a pair of Y-axis driving units 320 for moving the nozzle unit 200 in a horizontal direction, i.e., in a forward and backward direction in the plane of the substrate 101, at a constant speed. The Y-axis driving units 320 can comprise a motor, a moving rail, a guide rail, and the like. A non-contact linear motor may be used as the motor.

The nozzle unit 200 coats a photoresist composition uniformly onto a surface of the substrate 101 by discharging the photoresist composition while moving and scanning the substrate 101 from one side edge oriented orthogonal to the direction of travel of the nozzle unit 200 to the other opposite side edge of the substrate 101 using the Y-axis driving units 320. Alternatively, a coating process can be carried out in the same manner as described above by allowing the substrate 101 to slide in a direction orthogonal to the axis of a fixed nozzle unit 200.

Furthermore, although it has not been illustrated in the figure, a supply unit (not shown) for supplying a photoresist composition to be coated on the substrate 101 can be further installed at the nozzle unit 200, and a preliminary discharge device (not shown) can be installed at one side edge of the stage 100.

Thus, in an early stage of the process, the photoresist composition is supplied from the supply unit to the nozzle unit 200, and the nozzle unit 200 having the photoresist composition so supplied discharges the photoresist composition to the preliminary discharge device preparatory to coating the photoresist composition uniformly onto a surface of the substrate 101. The preliminary discharge thus serves to control initial discharge uniformity of the photoresist composition before the photoresist composition is coated onto the surface of substrate 101.

In order to coat the photoresist composition onto a glass substrate with a size of 1,100×1,200 mm or more corresponding to a fifth- to seventh-generation or newer display device, and in a specific embodiment, to a liquid crystal display device with a large screen, it is desirable to carry out the uniform coating of the photoresist composition with a single scan, to achieve the maximum uniformity and production yield in a produced organic film.

The length of the nozzle 200 is determined in accord with the area of the substrate 101 to be coated with the photoresist composition, and thus, it is desirable to complete the coating process with an even, single scan when coating the photoresist composition onto the surface of substrate 101.

Although a scanning-type spinless coating device has been described in a coating method of a photoresist composition according to an exemplary embodiment with reference to FIG. 1, it is also possible to coat the photoresist composition according to the specific embodiment with other spinless coating devices.

The aforementioned photoresist composition and coating method thereof is useful in forming an organic film pattern of a display device, particularly a liquid crystal display device.

Figure 2:
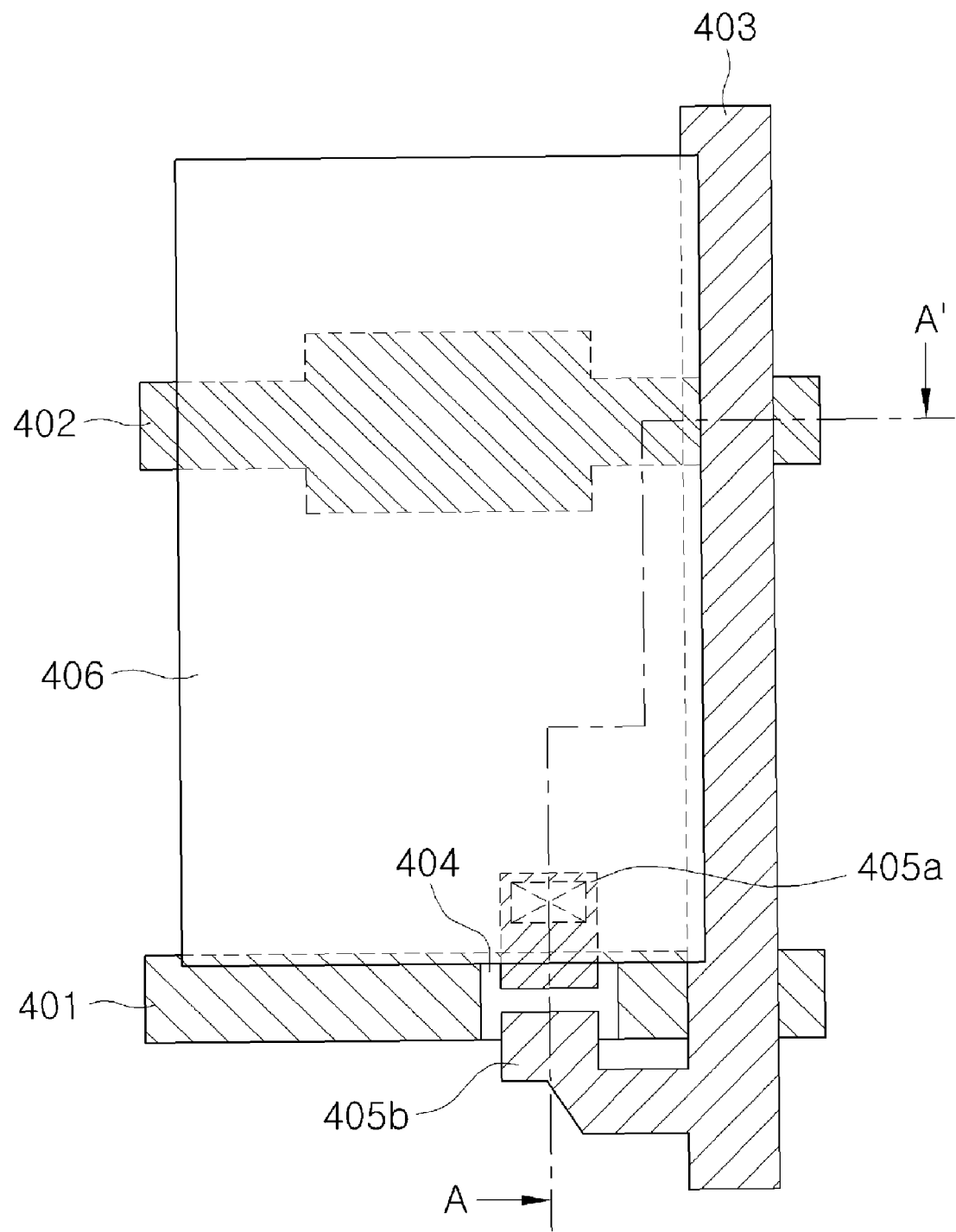
FIG. 2 is a plan view illustrating a unit cell of a thin film transistor on which an organic film pattern is formed using the photoresist composition according to an exemplary embodiment.
Figure 3:
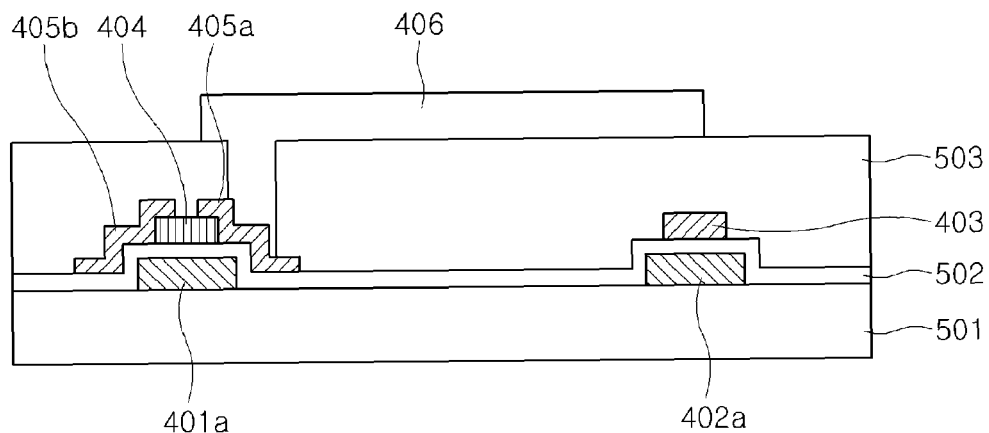
FIG. 3 is a cross-sectional view taken along line A-A' of FIG. 2.

FIG. 2 is a plan view illustrating a unit cell of a thin film transistor on which an organic film pattern is formed using the composition according to an exemplary embodiment of the present invention, and FIG. 3 is a sectional view taken along line A-A' of FIG. 2.

As shown in FIG. 2, a gate line 401 is disposed on a substrate (not shown in FIG. 2) in a lateral direction, and a storage electrode line 402 is disposed to be parallel with the gate line at a position spaced from the gate line by a predetermined distance. A data line 403 is disposed to perpendicularly intersect the gate line 401 and the storage electrode line 402.

A semiconductor layer 404 is patterned on the gate line 401 at a position adjacent to an intersection of the gate line 401 and the data line 403. A drain electrode 405a spaced apart from the data line 403 and a source electrode 405b extending from the data line 403, which are formed together when forming the data line 403, are disposed on a surface of the semiconductor layer 404 and are opposite to each other such that predetermined portions thereof overlap with the semiconductor layer 404.

Furthermore, a pixel electrode 406 formed of a transparent conductive film, such as for example indium tin oxide ("ITO"), is disposed on a surface of pixel region defined by the gate line 401 and the data line 403. At this time, the pixel electrode 406 is disposed over the entire pixel region so that it is brought into contact with the drain electrode 405a and also overlaps with portions of the data line 403 and the gate line 401.

Referring to FIG. 3, a gate electrode 401a and a storage electrode 402a spaced apart from the gate electrode by the predetermined distance are formed on a surface of lower substrate 501. A gate insulating film 502 is formed on the entire surface of the lower substrate 501 to cover gate electrode 401a and storage electrode 402a. A semiconductor layer 404 is patterned on a surface of the gate insulating film 502 formed on top of (i.e., opposite to) the gate electrode 401a. The drain electrode 405a and the source electrode 405b, formed simultaneously when forming the data line 403, are formed on the surface of semiconductor layer 404 and are spaced apart from each other.

An organic film pattern 503 formed by coating a photoresist composition according to an embodiment is formed on a front portion of a surface of the lower substrate 501 with the resulting structure formed thereon. The organic film pattern 503 has a contact hole through which the drain electrode 405a is exposed. The pixel electrode 406, which is brought into contact with the drain electrode 405a through the contact hole and also partially overlaps with portions of the gate electrode 401a and the data line 403, is formed on a surface of the organic film pattern 503 opposite data line 403 and drain electrode 405a.

The organic film pattern 503 functions as a passivation film as well as an insulation film between the pixel electrode 406 and the data line 403.

The organic film pattern 503 can be obtained by coating a photoresist composition according to an embodiment onto a surface of a substrate of a display device using the aforementioned spinless coating method to form an organic film, and then patterning the organic film.

The photoresist composition is coated on the substrate 101 on which the gate insulation film 502, the data line 403, the semiconductor layer 404, the drain electrode 405a, the source electrode 405b, and the like, are formed. Therefore, the organic film photoresist composition can be coated on a variety of materials including silicon oxides ($SiO_x$), silicon nitrides, doped silicon oxides, silicon, aluminum, indium tin oxide (ITO), indium zinc oxide ("IZO"), molybdenum, tantalum, copper, polysilicon, ceramic, a combination of aluminum and copper, and the like.

As described above, a photoresist composition is coated onto a surface of the substrate 101 using a spinless coating method to form an organic film. Then, the organic film pattern 503 is formed through processes of drying the organic film formed on the substrate under reduced pressure, soft baking the dried organic film, selectively exposing the soft baked organic film to light, developing the selectively exposed organic film, and curing the developed organic film.

Hereinafter, a process of forming an organic film pattern will be described in detail.

Figure 4A:
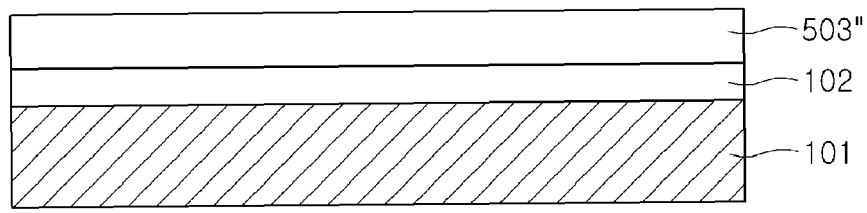
FIG. 4A is a cross-sectional view of a structure at an organic film formation step in a method of forming an organic film pattern according to an exemplary embodiment.

First, as shown in FIG. 4A, an organic film 503" is formed, using a spinless coating method, on a surface of lower structure 102 which comprises a variety of device structures, opposite the substrate 101 on which lower structure 102 is formed on a surface thereof.

Figure 4B:
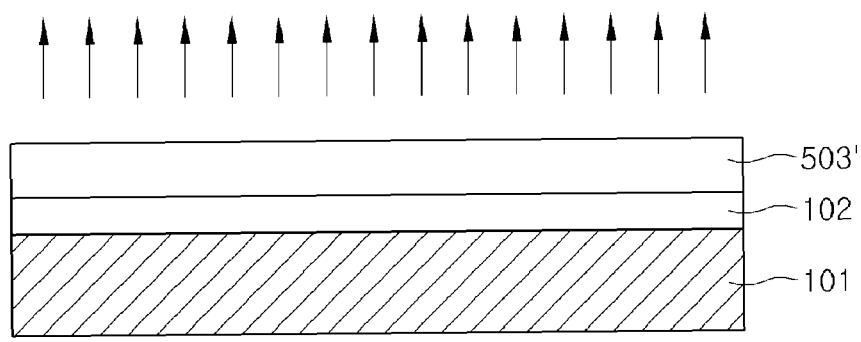
FIG. 4B is a cross-sectional view of a structure at an organic solvent evaporating step in the method of forming an organic film pattern according to an exemplary embodiment.

Then, as shown in FIG. 4B, the organic film 503" so formed on the surface of the lower structure 102 is dried under reduced pressure. Most of a solvent, i.e., about 80 to 90% of the solvent, contained in the organic film 503" evaporates while the organic film 503" is drying under reduced pressure.

The drying step includes a pre-pumping step and a main pumping step, which are sequentially carried out. The pre-pumping step is slowly carried out to reduce the pressure in a dryer containing the coated substrate having organic film 503" to a pressure of approximately $10^{-5}$ Pa, and the main pumping step is carried out faster than the pre-pumping step to pump the dryer to a pressure lower than that of the pre-pumping step. In this way, any organic solvent with relatively low vapor pressure is first evaporated in the pre-pumping step, and any remaining organic solvent with relatively high vapor pressure is then evaporated in the main pumping step. In such a case, evaporation of the organic solvents can be further promoted when using the organic solvents with different vapor pressures as compared with when using a single organic solvent.

Then, the dried organic film 503' is soft baked. In a soft baking process, a solvent that is not removed from and remains in the organic film 503' during the drying step is removed without thermally decomposing solid components of the organic film 503' and the organic film 503' is then solidified. Preferably, the soft baking process is carried out at a temperature of 80 to 130° C. until organic film 503' remains on substrate at a thickness of 4 μm or less.

In a specific embodiment, the soft baking process is conducted until an organic solvent is completely evaporated from the organic film 503' coated on the surface of lower structure 102.

Figure 4C:
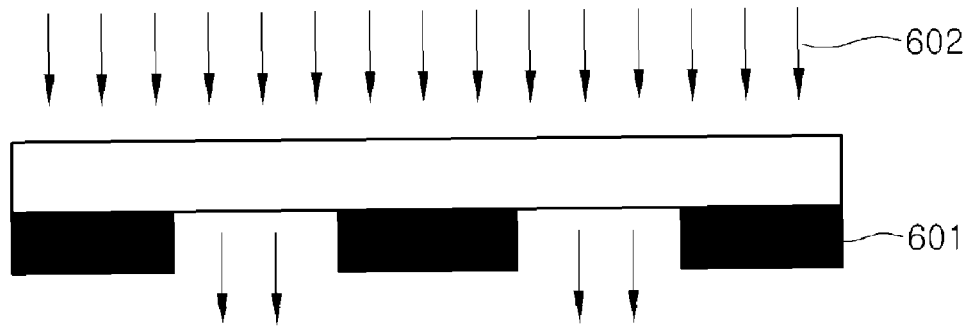
FIG. 4C is a cross-sectional view of a structure at an exposure step in the method of forming an organic film pattern according to an exemplary embodiment.

Next, the soft baked organic film 503' is exposed to light. As shown in FIG. 4C, the organic film 503' formed on the substrate 101 is selectively exposed to light, for example, ultraviolet rays 602 using a mask or template 601 such that a photosensitive compound in exposed regions ER of the organic film 503' is transformed by photoreaction into a soluble resin that in turn is dissolved by a subsequent developing process.

Figure 4D:
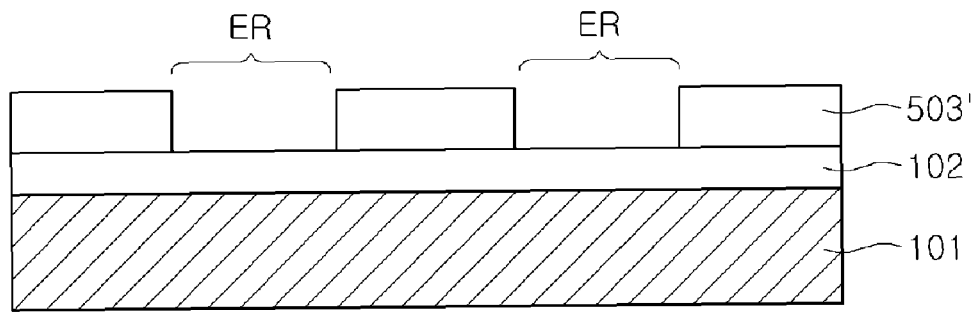
FIG. 4D is a cross-sectional view of a structure at a developing step in the method of forming an organic film pattern according to an exemplary embodiment.

Subsequently, a substrate 101 on which the selectively exposed organic film 503' is formed, as illustrated in FIG. 4D, is dipped into an alkaline aqueous developing solution and then left alone until all or almost all of, i.e., about 95% or more, of the exposed portions of the organic film 503' are dissolved. An aqueous alkaline developing solution as used in the embodiment can comprise an aqueous solution containing a base compound selected from the group consisting of tetramethyl ammonium hydroxide, alkali-metal hydroxide, or ammonium hydroxide, but is not limited thereto.

Figure 4E:
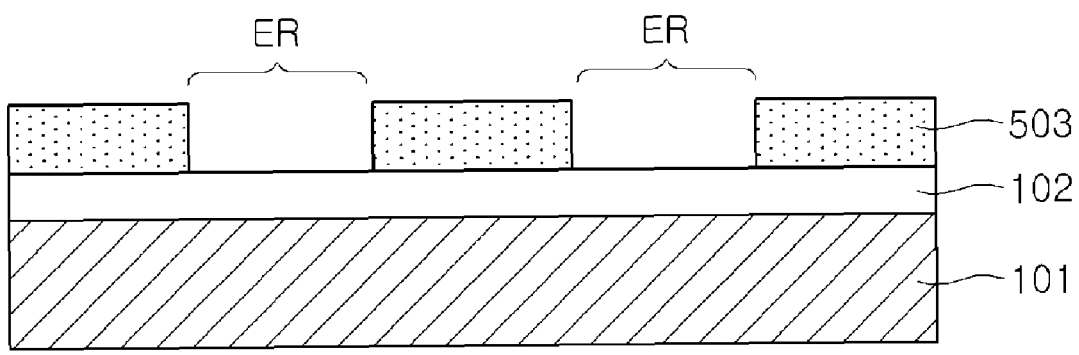
FIG. 4E is a cross-sectional view of a structure at a curing step in the method of forming an organic film pattern according to an exemplary embodiment.

Subsequently, adhesion and chemical resistance of the organic film can be further enhanced by thermal crosslinking, in which a chromophore is decomposed by exposure to light from a visible light region of the spectrum, where the chromophore is present in the developed organic film, and subsequently performing a heat treatment called a hard baking process as shown in FIG. 4E. In this process, organic polymeric resins and photosensitizers interact in a crosslinking reaction to form an insoluble hard organic film pattern 503. Such a crosslinking reaction is generally referred to as a curing process, where such curing process includes a flood exposure step (i.e., light exposure) and a hard bake (i.e., heat treatment) step.

The heat treatment is carried out at a temperature of less than that of a softening point of the organic film, and can be carried out, for example, at a temperature of 150 to 250° C. After the heat treatment has been completed, an organic film pattern 503 with a desired shape is obtained.

A intermediate structure comprising a substrate with the organic film pattern 503 formed thereon is treated with an etching solution or gas plasma to treat regions of the substrate 101 exposed by the organic film pattern 503. In this way, non-exposed regions of the substrate 101 are protected by the organic film pattern 503.

After the substrate 101 has been so treated, the fabrication of a display device, in which a fine circuit pattern such as a thin film transistor with a desired design is formed on the substrate 101, is completed.

When a defect within the pattern occurs, the organic film pattern 503 can be removed using a stripper, and the process can be then carried out again through a so-called "rework" process.

A fine circuit pattern is thus formed on a glass substrate with a size of fifth-generation grade (1,100×1,200 mm) or newer (e.g., $6^{th}$ or $7^{th}$ generation) in the same manner as described above from which a thin film transistor substrate can be derived, and the thin film transistor substrate is then laminated with a color filter substrate, such that a liquid crystal is interposed between the thin film transistor substrate and a color filter substrate, to fabricate a liquid crystal display device.

Hereinafter, the present invention will be further explained in detail through experimental examples and comparative experimental examples. It will be understood that the following experimental examples only illustrate the present invention by way of example, and the present invention is not limited by the following experimental examples.

Experimental Example 1

A photoresist composition for a liquid crystal display device circuit was prepared by mixing 82 g of a mixture of DAA, PGME and ACAC in a weight ratio of 45:25:30 respectively (i.e., 36.9 g of DAA, 20.5 g of PGME and 24.6 g of ACAC) as the organic solvent with 1.0 g of a photosensitizer and 17.0 g of a polysiloxane resin (silicone resin; SF-P2020 from TORAY) and then agitating the mixture to a rotating speed of 40 rpm at room temperature.

The photosensitizer was a mixture of 2,3,4-trihydroxy benzophenone-1,2-naphthoquinonediazide-5-sulfonate and 2,3, 4,4'-tetrahydroxybenzophenone-1,2-naphthoquinonediazide-5-sulfonate, mixed at a weight ratio of 1:1 (i.e., 0.5 g of each compound), and 500~4000 ppm. of an F-based surfactant was also included.

The resulting photoresist composition had a viscosity of 4.7 cps and within the recommended range of viscosity for use with a slit coater.

The prepared photoresist composition for a liquid crystal display device circuit was coated onto a glass substrate having a thickness of 0.7 mm using a slit coating method that is a kind of spinless coating method (see e.g., FIG. 1), and the glass substrate with the photoresist composition coated thereon was then dried under reduced pressure and then heated and dried at 100° C. for 150 seconds to obtain an organic film having a thickness of 3.5 μm. The thickness of the organic film so formed was measured to provide a basis for observing the effects of exposure and for determining transmissivity of the organic film.

Experimental Example 2

A photoresist composition for a liquid crystal display device circuit was prepared in the same method as in the experimental example 1, except that a mixture of DAA and PGME, mixed in a weight ratio of 70:30 respectively (i.e., 57.4 g of DAA and 24.6 g of PGME) was used as the organic solvent.

Experimental Example 3

A photoresist composition for a liquid crystal display device circuit was prepared by the same method as that used in the Experimental Example 1, except that DAA and CP mixed at a weight ratio of 65:35 (i.e., 53.3 g of DAA and 28.7 g of CP) were used as the organic solvents.

Comparative Experimental Example 1

A photoresist composition for a liquid crystal display device circuit with a viscosity of 9 cps was prepared by mixing 20.7 g of a polymeric resin represented by the following Chemical Formula 5, 76 g of ethyl cellosolve acetate (EDM) as an organic solvent, and 500 to 5,000 ppm of a Si-based surfactant, adding 3.3 g of a photosensitizer represented by the following Chemical Formula 6 to the mixture and then agitating the added mixture at a rotating speed of 40 rpm at room temperature:

[Chemical Formula 5]

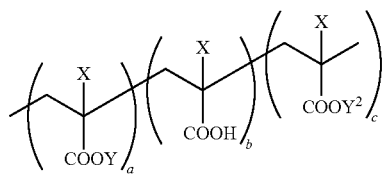

wherein a, b, and c are monomer mole fractions where a+b+c=1, X is H or a methyl group, $Y^1$ is an alkyl group or hydroxy alkyl group with 2 to 16 carbon atoms, and $Y^2$ is a compound represented by the following Molecular Formula 4:

[Molecular Formula 4]

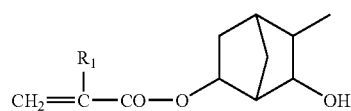

wherein $R_1$ is H or a methyl group. The photosensitizer is as generally represented by Chemical Formula 6:

[Chemical Formula 6]

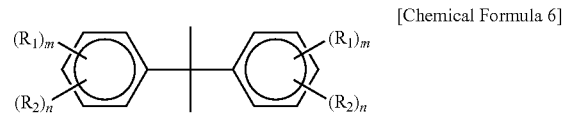

wherein $R_1$ is any one of H, OH and —$CH_3$, $R_2$ is DNQ represented by the Molecular Formula 3, and each of m and n is 1 to 4. In the specific photosensitizer used in comparative Example 1, $R_1$ and $R_2$ are disposed to the isopropylidene group.

Comparative Experimental Example 2

A photoresist composition for a liquid crystal display device circuit with a viscosity of 7 cps was prepared in the same method as in the experimental Comparative Example 1, except that 18.7 g of the polymeric resin and 78 g of the organic solvent, each as described in Comparative Experimental Example 1, were used.

Evaluation of Experimental Examples and Comparative Experimental Examples

The photoresist compositions for a liquid crystal display device circuit as prepared in the experimental examples and the comparative experimental examples were each coated onto glass substrates with a thicknesses of 0.7 mm and each glass substrate with the photoresist composition coated thereon was then dried under reduced pressure and then heated and dried at 100° C. for 150 seconds to obtain an organic film with a thickness of 3.5 μm. The thickness of the organic film so formed was measured to observe exposure and transmissivity of the organic film.

The above results are illustrated in the following Table 2. In Table 2, a glass substrate with a size of 1,100×1,300 mm was used as a substrate, and the glass substrate was segmented by lines, each of which is positioned every 100 mm. As used in the description, the machine direction ("MD") is a longitudinal direction along which the nozzle is fixed, and the traveling direction ("TD") is a scanning direction in which the nozzle is traveling, where the MD and TD are orthogonal to one another.

Here, a Cr-deposited glass substrate was used to observe stains on the substrate further in detail.

TABLE 2

|  | Thickness deviation (13 × 11 lines, TD × MD) | Cumulous stains | Resin streak |
|---|---|---|---|
| Experimental example 1 | 2.31 | ⊚ | ⊚ |
| Experimental example 2 | 2.58 | ○ | ○ |
| Experimental example 3 | 2.71 | ○ | ○ |

TABLE 2-continued

| | Thickness deviation (13 × 11 lines, TD × MD) | Cumulous stains | Resin streak |
|---|---|---|---|
| Comparative experimental example 1 | 2.93 | ⊚ | Δ |
| Comparative experimental example 2 | 2.97 | ⊚ | Δ |

(⊚: excellent (substantially free of observed defects), ○: good (minor amounts of observed defects present), Δ: not good (observable defects present), X: bad (significant amounts of observed defects present))

As shown in Table 2, the results when viewed for the presence of cumulous stains are equally excellent for the Experimental Example 1 and the Comparative Experimental Examples 1 and 2, and are good for the Experimental Examples 2 and 3.

However, the results when viewed for the presence of resin streaks are excellent for the Experimental Example 1, but are not good for the Comparative Experimental Examples 1 and 2.

A comparison of the thickness deviation results for the experimental examples and comparative experimental examples shows that the uniformity for the experimental examples is superior to (i.e., has a lower numerical value than) that of the Comparative Experimental Examples 1 and 2, and in particular, it can be seen that the Experimental Example 1 has most superior uniformity.

By using a photoresist composition, a coating method thereof, a method of forming an organic film pattern using the same, and a display device fabricated using the same as described herein, the photoresist composition can be suitably coated on a large substrate, the coating uniformity can be improved, and the occurrence of stains such as cumulous stains and resin streaks can be prevented.

Also, by using a photoresist composition, a coating method thereof, a method of forming an organic film pattern using the same, and a display device fabricated using the same as disclosed herein, coating speed and quality of a final product can be improved by use of a spinless coating method for large substrates.

Although the preferred embodiments have been described herein with reference to the accompanying drawings, it is to be understood that the present invention is not limited to those preferred embodiments, and that various other changes and modifications may be affected therein by one of ordinary skill in the related art without departing from the scope or spirit of the invention. All such changes and modifications are intended to be included within the scope of the invention as defined by the appended claims.

More specifically, though only a liquid crystal display device is illustrated by way of example throughout the entire specification including the preferred embodiments of the present invention, but a photoresist composition, a coating method of the photoresist composition, and a method of forming an organic film pattern using the photoresist composition according to embodiments of the present invention can be applied to a display device other than a liquid crystal display device, such as for example, an organic electroluminescent display device, which is within the technical scope disclosed herein.

What is claimed is:

1. A photoresist composition, comprising:
a polymeric resin with an incorporated polysiloxane resin;
a photosensitive compound; and
an organic solvent, wherein the polysiloxane resin is represented by the following Chemical Formula 1:

[Chemical Formula 1]

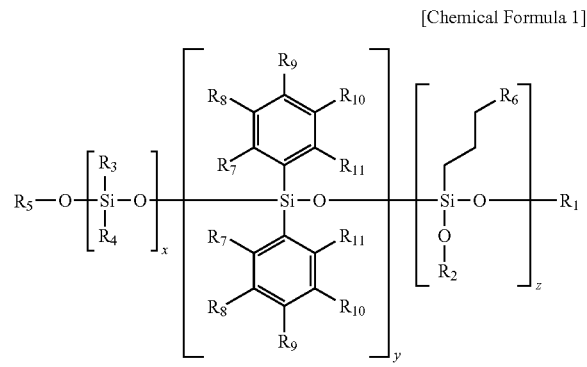

wherein x, y, and z each represent monomer mole fractions of greater than 0 and less than 1, where the sum of x+y+z is 1, and each of $R_1$, $R_2$, $R_3$, $R_4$, $R_5$, $R_6$, $R_7$, $R_8$, $R_9$, $R_{10}$, and $R_{11}$ is independently H, $C_mH_{2m+1}$ where m is 1 to 5, —OH, —$OC_mH_{2m+1}$ where m is 1 to 5, an acryl-based functional group, a functional group of the following Molecular Formula 1:

[Molecular Formula 1]

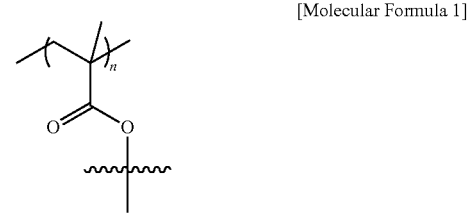

wherein n is an integer greater than 0, or a functional group of the following Molecular Formula 2:

[Molecular Formula 2]

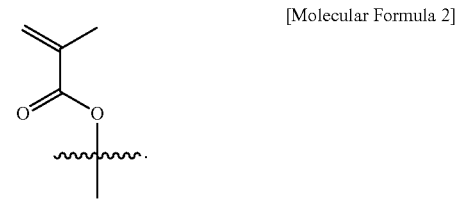

2. The photoresist composition as claimed in claim 1, wherein the polymeric resin has a weight-average molecular weight of 500 to 20,000.

3. The photoresist composition as claimed in claim 1, wherein the polymeric resin is present in an amount of 10 to 30% by weight, based on the total weight of the photoresist composition.

4. The photoresist composition as claimed in claim 1, wherein the photoresist composition has a viscosity of 1 to 25 cps.

5. The photoresist compound as claimed in claim 1, wherein the polysiloxane resin has the following Chemical Formula 2:

[Chemical Formula 2]

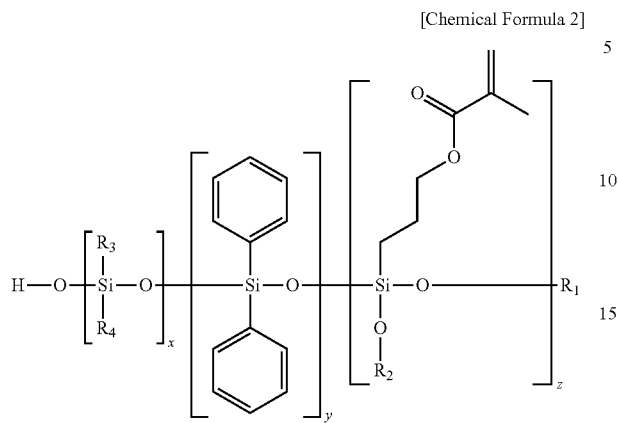

wherein x, y, and z each represent monomer mole fractions of greater than 0 and less than 1, where the sum of x+y+z is 1, and each of $R_1$, $R_2$, $R_3$, and $R_4$ is independently H or an alkyl group of the formula $C_nH_{2n+1}$, where n is 1 to 5.

6. The photoresist composition as claimed in claim 1, wherein the photosensitive compound is a diazide-based photosensitive compound.

7. The photoresist composition as claimed in claim 6, wherein the diazide-based photosensitive compound is present in an amount of 1 to 10% by weight of the photoresist composition.

8. The photoresist composition as claimed in claim 7, wherein the diazide-based photosensitive compound is present in an amount of 1 to 5% by weight of the photoresist composition.

9. The photoresist composition as claimed in claim 6, wherein the diazide-based photosensitive compound is prepared by reacting at least one hydroxy compound and one sulfonic acid derivative selected from the group consisting of tetrahydroxy benzophenone, a derivative of 2-diazo-1-naphthol-5-sulfonic acid, polyhydroxy benzophenone, and a derivative of 1,2-naphthoquinone diazide sulfonic acid.

10. The photoresist composition as claimed in claim 9, wherein the diazide-based photosensitive compound is prepared by esterification of tetrahydroxy benzophenone with a derivative of 2-diazo-1-naphthol-5-sulfonic acid.

11. The photoresist composition as claimed in claim 6, wherein the diazide-based photosensitive compound comprises at least one selected from the group consisting of 2,3,4,4'-tetrahydroxybenzophenone-1,2-naphthoquinonediazide-5-sulfonate, diazonaphthoquinone sulfonate ester, and 2,3,4-trihydroxy benzophenone-1,2-naphthoquinonediazide-5-sulfonate.

12. The photoresist composition as claimed in claim 6, wherein the diazide-based photosensitive compound is a material represented by the following Chemical Formula 3:

[Chemical Formula 3]

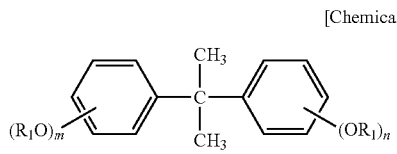

wherein each of m and n is 1 to 3, $R_1$ is any one selected from the group consisting of H, $C_xH_y$, and DNQ represented by the following Molecular Formula 3:

[Molecular Formula 3]

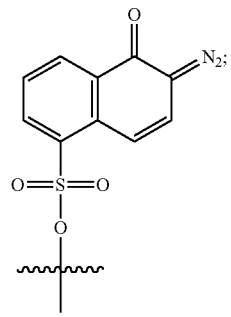

or a material represented by the following Chemical Formula 4:

[Chemical Formula 4]

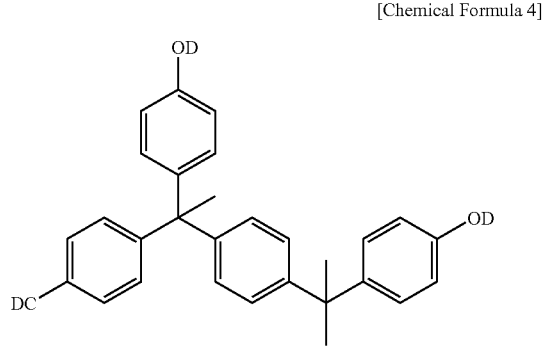

wherein D is DNQ represented by Molecular Formula 3.

13. The photoresist composition as claimed in claim 1, wherein the organic solvent is present in an amount of 60 to 90% by weight of the photoresist composition.

14. The photoresist composition as claimed in claim 7, wherein the organic solvent is present in an amount of 60 to 90% by weight of the photoresist composition.

15. The photoresist composition as claimed in claim 1, wherein the organic solvent is at least one selected from the group consisting of an acetate-based solvent, a lactate-based solvent, a propionate-based solvent, and an ether-based solvent.

16. The photoresist composition as claimed in claim 1, wherein the organic solvent is at least one selected from the group consisting of 4-hydroxy-4-methyl-2-pentanone, propylene glycol methyl ether, ethyl acetoacetate, ethyl lactate, ethyl cellosolve acetate, gamma-butyrolactone, 2-methoxyethyl acetate, ethyl beta-ethoxypropionate, n-propyl acetate, and n-butyl acetate.

17. A photoresist composition, comprising:
 a polymeric resin with an incorporated polysiloxane resin;
 a photosensitive compound; and
 an organic solvent,
 wherein the organic solvent is a mixture of 4-hydroxy-4-methyl-2-pentanone, propylene glycol methyl ether, and ethyl acetoacetate.

18. The photoresist composition as claimed in claim 1, further comprising at least one additive selected from the group consisting of a coloring agent, dye, an anti-striation agent, a plasticizer, an adhesion promoter, and a surfactant.

19. The photoresist composition as claimed in claim 18, wherein the additive has a molecular weight lower than the weight averaged molecular weight of the polymeric resin.

20. A photoresist composition, comprising:
a polymeric resin with an incorporated polysiloxane resin;
a photosensitive compound; and
an organic solvent, and
at least one additive selected from the group consisting of a coloring agent, dye, an anti-striation agent, a plasticizer, an adhesion promoter, and a surfactant,
wherein the surfactant is a Si-based surfactant or an F-based surfactant.

21. A photoresist composition, comprising:
a polymeric resin with an incorporated polysiloxane resin;
a photosensitive compound; and
an organic solvent, and
at least one additive selected from the group consisting of a coloring agent, dye, an anti-striation agent, a plasticizer, an adhesion promoter, and a surfactant,
wherein the surfactant is present in the composition in an amount of 500 to 4,000 ppm.

22. A coating method of a photoresist composition, comprising:
coating the photoresist composition as claimed in claim 1, onto a surface of a substrate by a spinless coating method.

23. A coating method of a photoresist composition, comprising:
storing the photoresist composition as claimed in claim 1, in a storage unit of a coating device;
discharging the stored photoresist composition onto a surface of a substrate, starting from any one side edge on the surface of the substrate, through a nozzle of the coating device; and
moving the nozzle from the one side edge of the substrate to the opposite side edge of the substrate to continuously coat the photoresist composition discharged from the nozzle onto the surface of the substrate.

24. A method of forming an organic film pattern, comprising:
coating the photoresist composition as claimed in claim 1, onto a surface of a substrate; and
patterning the photoresist composition coated on the surface of the substrate.

25. The method as claimed in claim 24, wherein the substrate is a thin film transistor substrate.

26. The method as claimed in claim 24, wherein patterning the photoresist composition comprises:
drying the photoresist composition under reduced pressure;
soft baking the dried photoresist composition;
selectively exposing the soft baked photoresist composition to light;
developing the selectively exposed photoresist composition; and
curing the developed photoresist composition.

27. The method as claimed in claim 26, wherein developing the photoresist composition comprises dipping the substrate coated with the exposed photoresist composition into at least one aqueous alkaline developing solution, where the aqueous alkaline developing solution comprises a base compound selected from the group consisting of alkali hydroxide, ammonium hydroxide, and tetramethyl ammonium hydroxide.

28. A display device derived from a substrate having an organic film disposed thereon by coating a surface of the substrate with the photoresist composition as claimed in claim 1.

29. An intermediate structure for a display device comprising a substrate having disposed thereon a fine patterned organic film derived from the photoresist composition as claimed in claim 1.

30. A thin film transistor substrate derived from the intermediate structure of claim 29.

31. A display device derived from the thin film transistor substrate of claim 30.

* * * * *